United States Patent
Wu et al.

(10) Patent No.: US 8,514,875 B2
(45) Date of Patent: Aug. 20, 2013

(54) PROCESSING OF MULTIPLE CELLS IN A NETWORK DEVICE WITH TWO READS AND TWO WRITES ON ONE CLOCK CYCLE

(75) Inventors: Chien-Hsien Wu, Cupertino, CA (US);
Yook-Khai Cheok, Palo Alto, CA (US);
Eugene Opsasnick, Cupertino, CA (US)

(73) Assignee: Broadcom Corporation, Irvine, CA (US)

(*) Notice: Subject to any disclaimer, the term of this patent is extended or adjusted under 35 U.S.C. 154(b) by 1017 days.

(21) Appl. No.: 11/594,743

(22) Filed: Nov. 9, 2006

(65) Prior Publication Data

US 2007/0104209 A1 May 10, 2007

Related U.S. Application Data

(60) Provisional application No. 60/772,885, filed on Feb. 14, 2006, provisional application No. 60/735,252, filed on Nov. 10, 2005.

(51) Int. Cl.
| | |
|---|---|
| *G06F 13/00* | (2006.01) |
| *G06F 13/28* | (2006.01) |
| *G11C 7/10* | (2006.01) |
| *G06F 13/16* | (2006.01) |
| *G06F 12/08* | (2006.01) |

(52) U.S. Cl.
CPC ............ *G11C 7/1039* (2013.01); *G11C 7/1072* (2013.01); *G06F 13/1668* (2013.01); *G06F 13/1689* (2013.01); *G06F 12/0855* (2013.01); *G06F 12/0853* (2013.01)
USPC ............... 370/413; 370/412; 710/20; 710/21; 711/149; 711/167; 711/168; 711/169; 711/100

(58) Field of Classification Search
CPC G11C 7/1039; G11C 7/1072; G06F 13/1668; G06F 13/1689; G06F 12/0855; G06F 12/0853
USPC ..................... 370/395.7, 412; 711/100, 140, 711/149, 167, 168, 131, 169; 710/20, 21
See application file for complete search history.

(56) References Cited

U.S. PATENT DOCUMENTS

| | | | | |
|---|---|---|---|---|
| 4,672,360 | A * | 6/1987 | Bradley et al. ................ | 341/104 |
| 5,811,998 | A * | 9/1998 | Lundberg et al. ............. | 327/156 |
| 6,202,139 | B1 * | 3/2001 | Witt et al. ..................... | 711/169 |
| 6,625,157 | B2 * | 9/2003 | Niu et al. ................ | 370/395.71 |
| 7,315,540 | B2 * | 1/2008 | Bosshart ....................... | 370/369 |
| 7,352,836 | B1 * | 4/2008 | Mendenhall .................. | 375/372 |

(Continued)

*Primary Examiner* — Ayaz Sheikh
*Assistant Examiner* — Tarell Hampton
(74) *Attorney, Agent, or Firm* — McDermott Will & Emery LLP

(57) ABSTRACT

A network device for processing data includes at least one ingress module for performing switching functions on incoming data, a memory management unit for storing the incoming data in a memory and at least one egress module for transmitting the incoming data to at least one egress port. The memory management unit is configured to receive data at a clock speed for the network device and write the data to the memory using a multiplied clock speed that is a multiple of the clock speed for the network device, read out the data from the memory at the multiplied clock speed and provide the data to the at least one egress module at the clock speed for the network device, where the multiplied clock speed is used to sample the clock speed for the network device to place domains of the multiplied clock speed and the clock speed for the network device in phase.

20 Claims, 7 Drawing Sheets

(56) References Cited

U.S. PATENT DOCUMENTS

| | | | |
|---|---|---|---|
| 2002/0012356 A1* | 1/2002 | Li et al. | 370/423 |
| 2004/0062258 A1* | 4/2004 | Grow et al. | 370/412 |
| 2005/0013302 A1* | 1/2005 | Lee et al. | 370/395.7 |
| 2005/0129020 A1* | 6/2005 | Doyle et al. | 370/392 |
| 2006/0209820 A1* | 9/2006 | Arai et al. | 370/389 |

* cited by examiner

Signal Name:
  Input side

- adda/cea/wea
- sel_adda/sel_csa/sel_wea
- adda_in/csa_in/wea_in
- addc/csc/wec
- addc_q/csc_q/wec_q
- addb/csb/web
- sel_addb/sel_csb/sel_web
- addb_in/csb_in/web_in
- addd/csd/wed
- addd_q/csd_q/wed_q
- dina
- dinc
- dinc_q
- sel_dina
- dina_in
- dinb
- dind
- dind_q
- sel_dinb
- dinb_in
- mux_sel
- coreclk Signal Name:
  Output side 100. douta_out
101. douta_q
102. douta
103. doutb_out
104. doutb_q
105. doutc
106. doutd
107.  mux_sel_outa
108.  mux_sel_outc
109. captured_douta
110. captured_doutb
111. captured_doutc
112. captured_doutd

Fig. 4

US 8,514,875 B2

PROCESSING OF MULTIPLE CELLS IN A NETWORK DEVICE WITH TWO READS AND TWO WRITES ON ONE CLOCK CYCLE

CROSS-REFERENCE TO RELATED APPLICATIONS

This application claims priority of U.S. Provisional Patent Application Ser. No. 60/735,252, filed on Nov. 10, 2005, and U.S. Provisional Patent Application Ser. No. 60/772,885, filed on Feb. 14, 2006. The subject matter of the earlier filed applications is hereby incorporated by reference.

BACKGROUND OF THE INVENTION

1. Field of the Invention

The invention relates to a method and apparatus for high performance switching in local area communications networks. In particular, the invention relates to a process of accomplishing two read operations and two write operations during a clock cycle.

2. Description of the Related Art

A switching system may include one or more network devices, such as an Ethernet switching chip, each of which includes several modules that are used to process information that is transmitted through the device. Specifically, the device includes at least one ingress module, a Memory Management Unit (MMU) and at least one egress module. The ingress module includes switching functionality for determining to which destination port a packet should be directed. The MMU is used for storing packet information and performing resource checks. The egress module is used for performing packet modification and for transmitting the packet to at least one appropriate destination port. One of the ports on the device may be a CPU port that enables the device to send and receive information to and from external switching/routing control entities or CPUs. Some devices also include a CPU processing module through which the device interfaces with external CPU ports.

One aspect of a network device that can result in a bottleneck that can hamper overall processing speed of the network device is the reading and writing of data to a memory. The buffers that are contained at the output ports are not sufficient to hold all of the data that may be sent out. In addition, output ports may have different speeds and may need to receive more or less data depending on operating conditions. Therefore, the function of the MMU becomes very important, in that the unit assists in the flow of data and determines how quickly data can be written to and read out of a memory. Thus, there is a need in the prior art for enhanced methods of reading and writing data that will not adversely affect the throughput of a network device.

BRIEF DESCRIPTION OF THE DRAWINGS

For the present invention to be easily understood and readily practiced, various embodiments will now be described, for purposes of illustration and not limitation, in conjunction with the following figures:

FIG. 4 provides the signals on the input and output sides used in an exemplary embodiment of the present invention;

DETAILED DESCRIPTION OF THE PREFERRED EMBODIMENTS

In a clock-based system, according to one embodiment of the invention, a twice-speed clock signal can be used to drive a dual port memory to be able to make two read commands and two write commands in a single clock cycle. It takes three regular (1×) clock cycles to complete each read or write command. Since every command is pipelined, for every cycle, four commands can be fed in without any bandwidth conflict problem. A pipeline design of flip-flops is used to input addresses, commands and data into a dual port memory. The pipeline of flip-flops is used to capture the read data. This design uses both the 1× and the 2× clock. The main synchronization method uses the 2× clock signal to sample the 1× clock signal in order to place the two clock domains in phase. Then, this in-phase information is used to pick out the data from the 1× clock domain and retain it as 2× clock data. The synchronization on the read data path samples data with the 2× clock to create a margin before 1× clock capture of the data. This will create a slack setup and hold margin. The whole synchronization design tracks the relation between the 1× clock and the 2× clock. Having these two clocks in phase, the system can still tolerate at least plus or minus ⅛ cycle time jitter.

Figure 1:
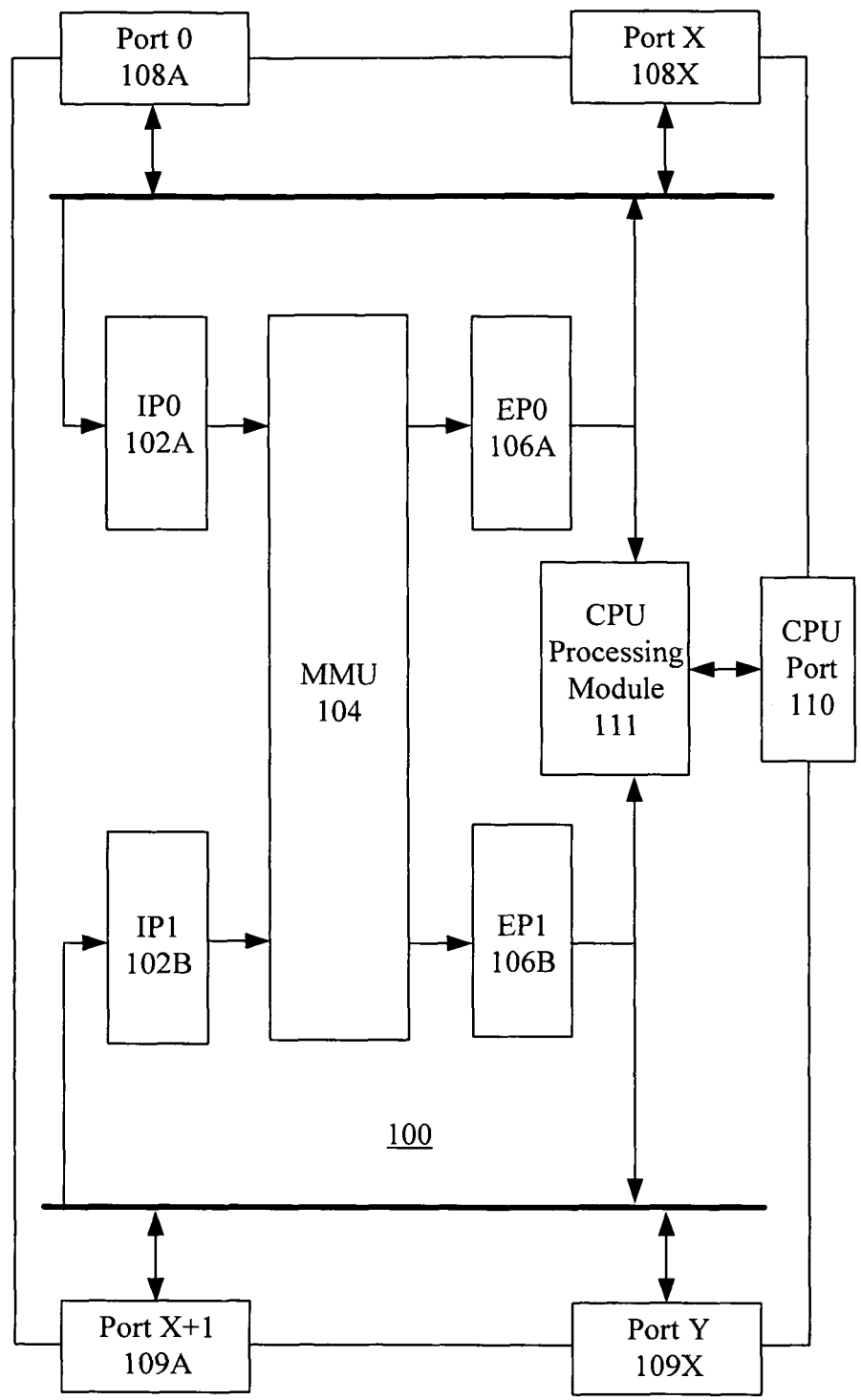
FIG. 1 is an illustration of a network device in which an embodiment of the present invention may be implemented.

FIG. 1 illustrates a network device, such as a switching chip, in which an embodiment the present invention may be implemented. Device 100 includes ingress modules 102A and 102B, a MMU 104, and egress modules 106A and 106B. Ingress modules 102A and 102B are used for performing switching functionality on an incoming packet. MMU 104 is used for storing packets and performing resource checks on each packet. Egress modules 106A and 106B are used for performing packet modification and transmitting the packet to an appropriate destination port. Each of Ingress modules 102A, 102B, MMU 104 and Egress modules 106A and 106B include multiple cycles for processing instructions generated by that module. Device 100 implements a dual-pipelined approach to process incoming packets. One aspect which affects the performance of device 100 is the ability of the pipelines to process one packet every clock cycle. It is noted that while the embodiment illustrated in FIG. 1 shows dual-pipelines, the present invention may also be applicable to systems that use a single pipeline or more than two pipelines.

Device 100 can also include a number of ports to send and receive data, such as Port 0 to PortX, 108A-108X, and Port X+1 to PortY, 109A-109X. The ports can be separated and are serviced by different ingress and egress port modules to support the dual-pipeline structure. One or more internal fabric high speed ports, for example a high speed port, or more external Ethernet ports may be configured from the above-discussed ports. The network device can also include a CPU port 110 and a CPU processing module 111 to communicate with an external CPU. High speed ports are used to interconnect various network devices in a system and thus form an internal switching fabric for transporting packets between external source ports and one or more external destination ports. As such, high speed ports are not externally visible outside of a system that includes multiple interconnected network devices. CPU port 110 can be used to send and receive packets to and from external switching/routing control entities or CPUs. Device 100 interfaces with external/off-chip CPUs through a CPU processing module 11 1, which interfaces with a PC1 bus that connects device 100 to an external CPU.

Network traffic also enters and exits device 100 through external ports 108A-108X and 109A-109X. Specifically, traffic in device 100 is routed from an external source port to one or more unique destination ports. In one embodiment of the invention, device 100 supports physical Ethernet ports and logical (trunk) ports. A physical Ethernet port is a physical port on device 100 that is globally identified by a global port identifier. In an embodiment, the global port identifier includes a module identifier and a local port number that uniquely identifies device 100 and a specific physical port. The trunk ports are a set of physical external Ethernet ports that act as a single link layer port. Each trunk port is assigned a global trunk group identifier (TGID). According to an embodiment, device 100 can support up to 128 trunk ports, with up to 8 members per trunk port, and up to 29 external physical ports.

Once a packet enters device 100 on a source port 109A-109X or 108A-108X, the packet is transmitted to one of the ingress modules 102A or 102B for processing. Packets may enter device 100 from a XBOD or a GBOD. The XBOD is a block that has one 10GE/12G MAC and supports packets from high speed ports and the GBOD is a block that has 12 10/100/1G MAC and supports packets from other ports.

The architecture of the network device provides for the ability to process data received quickly and also allows for a flexibility of processing. A part of this flexibility comes from the pipeline structure that is used to process packets once they are received. Data from the packet and attributes of that packet move through the modules of the network device, discussed above, in a pipeline structure. Each stage in the pipeline structure requires a set number of clock cycles and the packets are processed in order. Therefore, the packet is parsed, table lookups are performed, a decision routing process is performed and the packet is modified, before being sent out on an egress port. Each stage in the pipeline performs its function so that the overall function of the network device is achieved.

Figure 2:
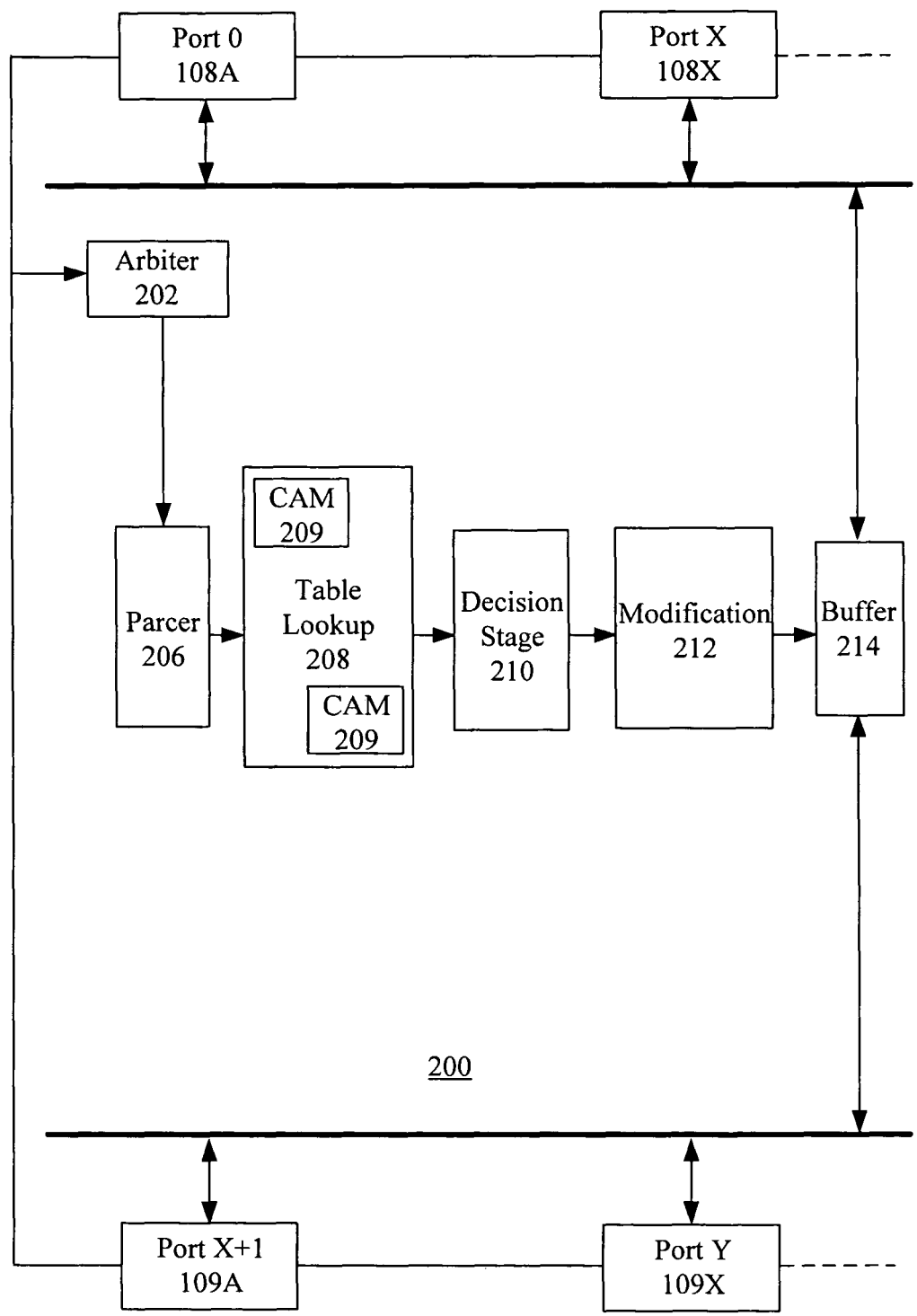
FIG. 2 illustrates a centralized egress pipeline architecture of an ingress stage in an exemplary embodiment of the present invention.

FIG. 2 illustrates a centralized egress pipeline architecture 200 of egress stages 106A and 106B, i.e. one side of the dual-pipeline. The egress pipeline can include an arbiter 202, a parser 206, a table lookup stage 208, multiple content-addressable memories (CAMs) 209, a decision stage 210, a modification stage 212 and a data buffer 214. Arbiter 202 provides arbitration for accessing egress pipeline 200 resources between packet data and control information from MMU and information from the CPU. Parser 206 performs packet parsing for table lookups and modifications. Table lookup stage 208 performs table lookups for information transmitted from parser 206, through use of the CAMs 209. The decision stage 210 is used for deciding whether to modify, drop or otherwise process the packet. The modification stage 212 makes modifications to the packet data based on outputs from previous stages of the pipeline.

Arbiter 202 collects packet data and control information from MMU 104 and read/write requests to registers and memories from the CPU and synchronizes the packet data and control information from MMU 104 and writes the requests from the CPU in a holding register. Based on the request type from the CPU, arbiter 202 generates pipeline register and memory access instructions and hardware table initialization instructions. After arbiter 202 collects packet data, CPU requests and hardware table initialization messages, it generates an appropriate instruction. According to an embodiment, arbiter 202 generates a Start Cell of Packet instruction, an End Cell of Packet instruction, a Middle Cell of Packet instruction, a Start-End Cell of Packet instruction, a Register Read Operation instruction, a Register Write Operation instruction, a Memory Read Operation instruction, a Memory Write Operation instruction, a Memory Reset Write Operation instruction, a Memory Reset Write All Operation instruction and a No Operation instruction. Egress pipeline resources associated with Start Cell of Packet instructions and Start-End Cell of Packet instructions are given the highest priority by arbiter 204. End Cell of Packet instructions, Middle Cell of Packet instructions, Register Read Operation instructions, Register Write Operation instructions, Memory Read Operation instructions and Memory Write Operation instructions receive the second highest priority from arbiter 204. Memory Reset Write Operation instructions and Memory Reset Write All Operation instructions receive the third highest priority from arbiter 204. No Operation instructions receive the lowest priority from arbiter 204.

After receiving an instruction from arbiter 204, the parser 206 parses packet data associated with the Start Cell of Packet instruction and the Start-End Cell of Packet instruction using the control information and a configuration register transmitted from arbiter 202. According to an embodiment, the packet data is parsed to obtain L4 and L3 fields which appear in the first 148 bytes of the packet. Table lookup stage 208 then receives all packet fields and register values from parser 206.

In 1× clock-based system, a 2× speed of the clock is used to drive a dual port memory to be able to make two read and two write commands on the one clock cycle. It takes three 1× clock cycles to complete each read or write command. Since every command is pipelined, for every cycle, according to at least one embodiment, four commands can be fed in without any bandwidth conflict problem. This is one benefit of having the dual pipelined inputs and outputs discussed above.

Figure 3:
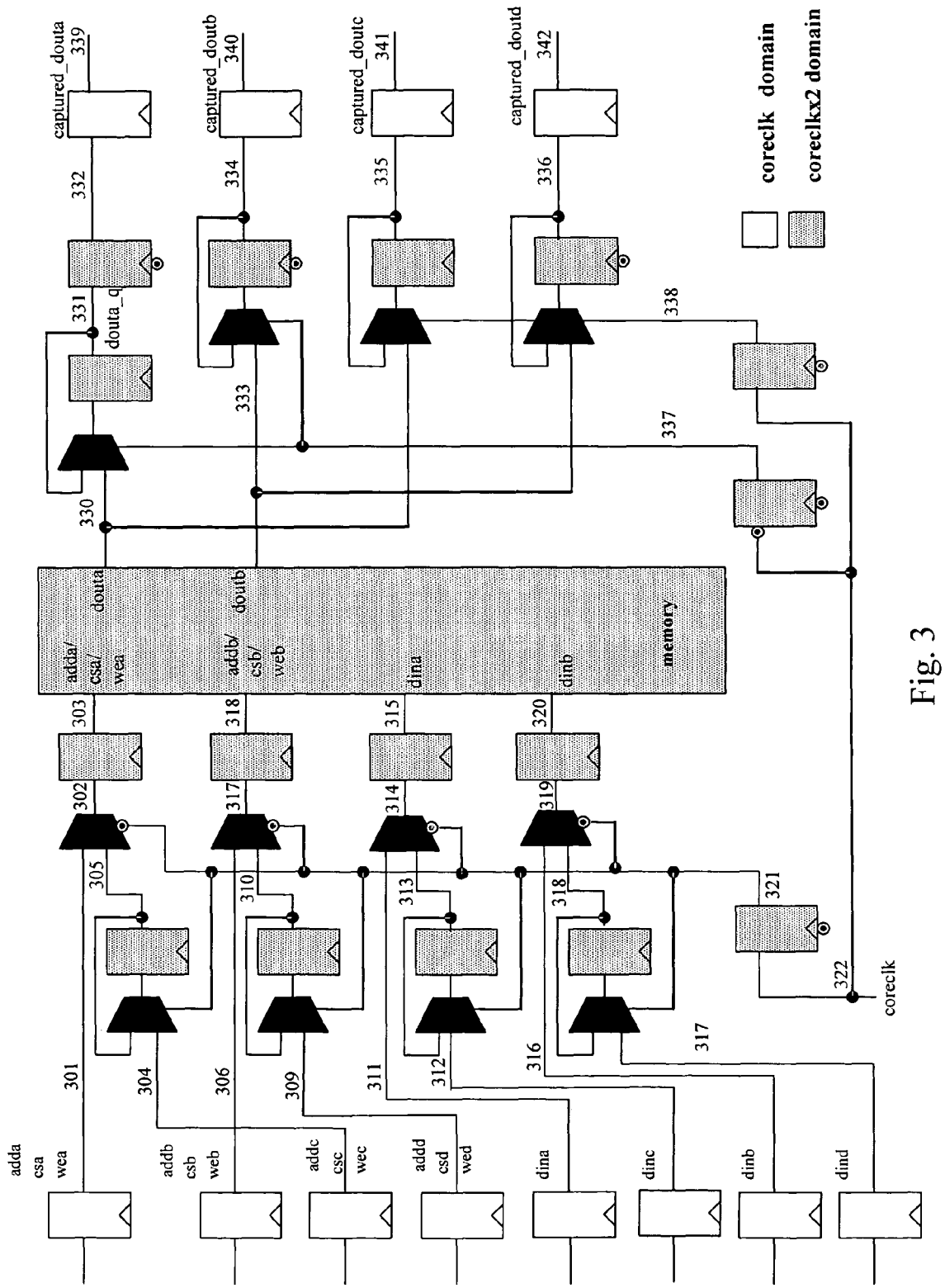
FIG. 3 illustrates a memory wrapper in an exemplary embodiment of the present invention.

A pipeline design of flip-flops is used to input addresses, commands and data into a dual port memory. An exemplary system is illustrated in FIG. 3. The memory wrapper illustrated generally supports four (4) Write/Read ports, i.e., in embodiments of the invention, generally the number of Write/Read ports represents a total number of ports, such as 4 Write/Read ports represents 2 Write and 2 Read ports for a total of 4 ports. The four (4) Write/Read ports described, although exemplary and not limiting upon the scope of the invention, in the current embodiment, designating the number of Write/Read ports as 4 does not represent a total of each type of port, such as 4 Write and 4 Read ports, which would total 8 ports. A memory wrapper acts to connect global memory shared by many processing modules through communication channels. With respect to the present invention, the memory wrapper allows for many read and write operations to access the shared memory. The shaded portions illustrate elements that are "operating" on the 2× clock domain and the non-shaded elements are operating on the 1× clock domain. The inputs and outputs are also provided in FIG. 4 for clarity.

An example of the main synchronization method uses the 2× clock signal to sample the 1× clock in order to render the two clock domains in phase. This is illustrated at 322 in FIG. 3, where the flip-flop operating at the doubled clock samples the non-doubled clock, i.e. the coreclk. Based on the output, a selection can be made, so that data from the 1× clock domain can be picked out or retained in the 2× clock data. A similar selection signal is also provided at 337 and 338. The data, command and address signals from ports a, b, c and d are also illustrated, as input 301, 304, 306, 309, 311, 312, 316 and 317. Each of the signals is taken in pairs, such that all of the signals from the 1× clock domain can be utilized in the 2× clock domain. Based on the timing and selection signals, the next level inputs are 305, 310, 313 and 318. Based on those input signals, one of the signals is selected as inputs 302, 307, 314 and 319, where those selected inputs are input into a final set of input flip-flops to result in the four signals, 303, 318, 315 and 320, that are applied to the memory.

Figure 5:
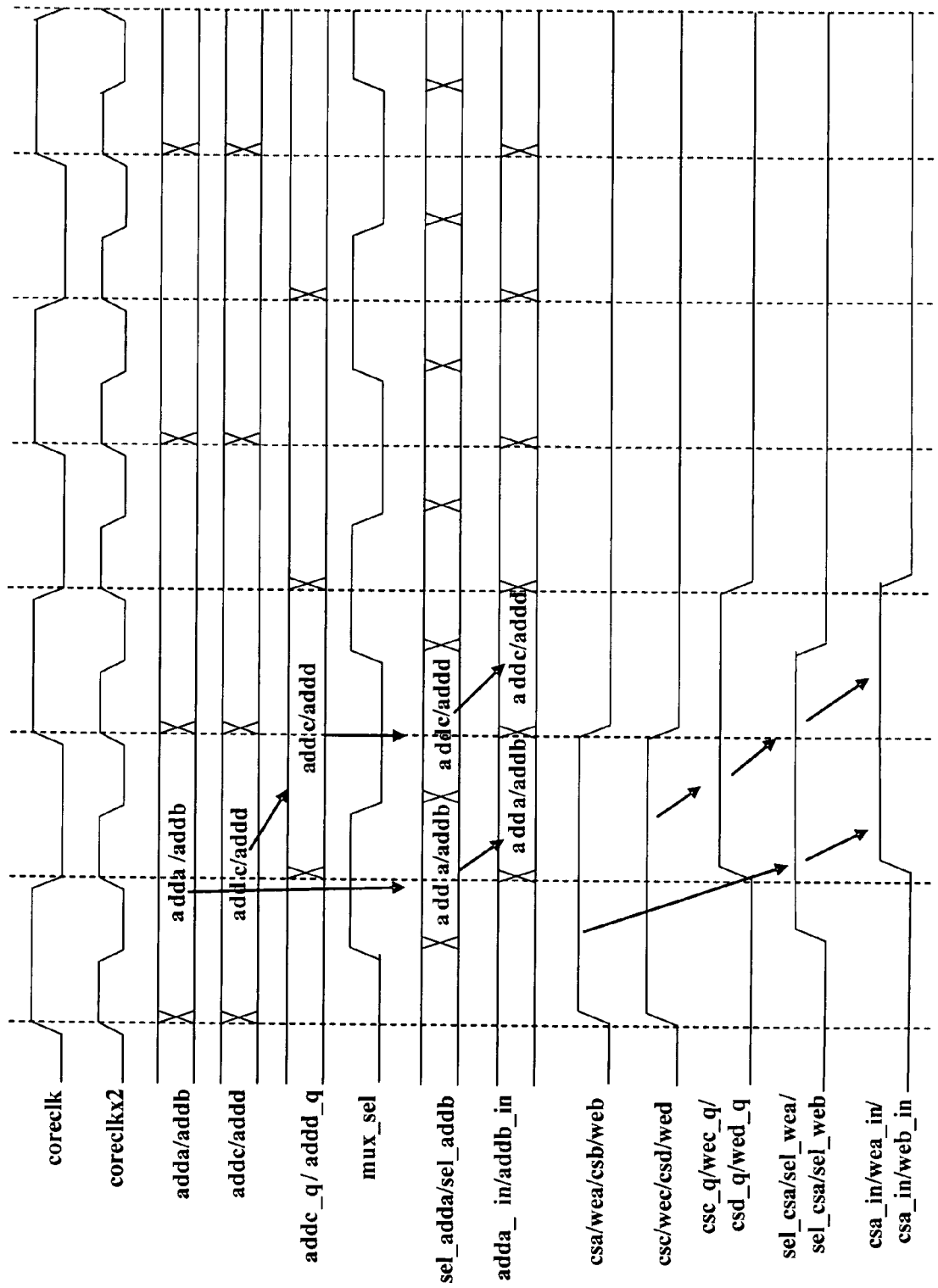
FIG. 5 provides a diagram showing the timing for a memory wrapper input address and command in an exemplary embodiment of the present invention.

This is further illustrated in FIG. 5, where the address and command data signals are illustrated. The paired inputs in the slower domain are received such that the signals can be recognized in the doubled clock domain. As illustrated, adda and addb addresses are chained and shifted so that both will be in the doubled clock domain as provided in adda_in/addb_in, in FIG. 5. A similar process is performed for addc and addd, so that those additional addresses can be utilized in the next cycle of the 2× clock domain. Similar shifting also occurs with command signals, as illustrated in the lower half of the timing diagrams in FIG. 5.

Figure 6:
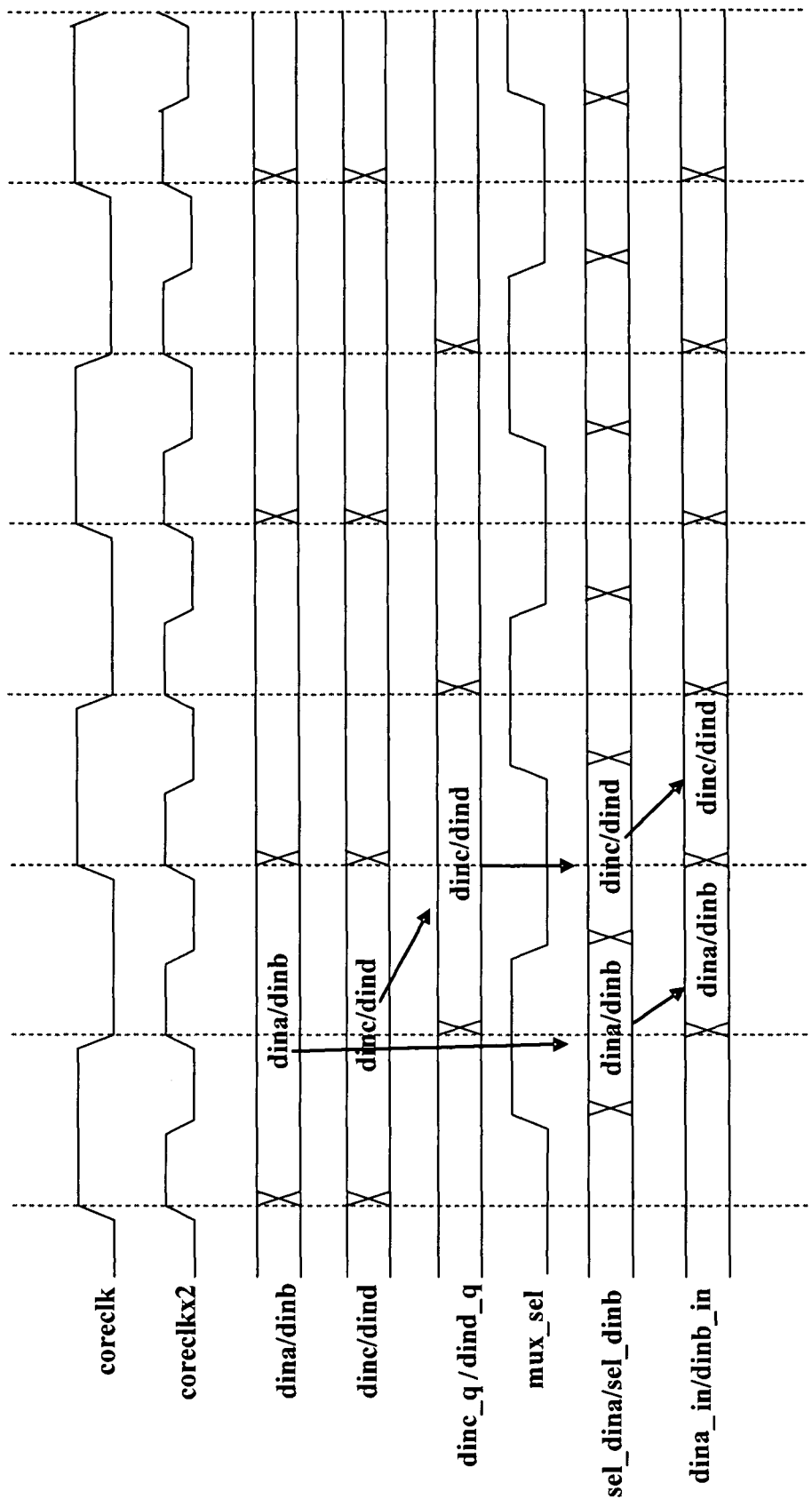
FIG. 6 provides a diagram showing the timing for memory wrapper input data in an exemplary embodiment of the present invention.

The timing of the data is illustrated in FIG. 6 and show similar results. FIG. 6 again shows the 1× and 2× clock domains and shows the chaining together of dina and dinb, as well as dinc with dind, so that all of the data is transformed into the 2× clock domain. As illustrated in the timing diagram for dina_in/dinb_in, all of the a-d data inputs are accepted in two clock cycles of the doubled clock domain. Given the input of the address, command and data signals at the doubled clock rate, the memory can be accessed at the same doubled clock rate.

Figure 7:
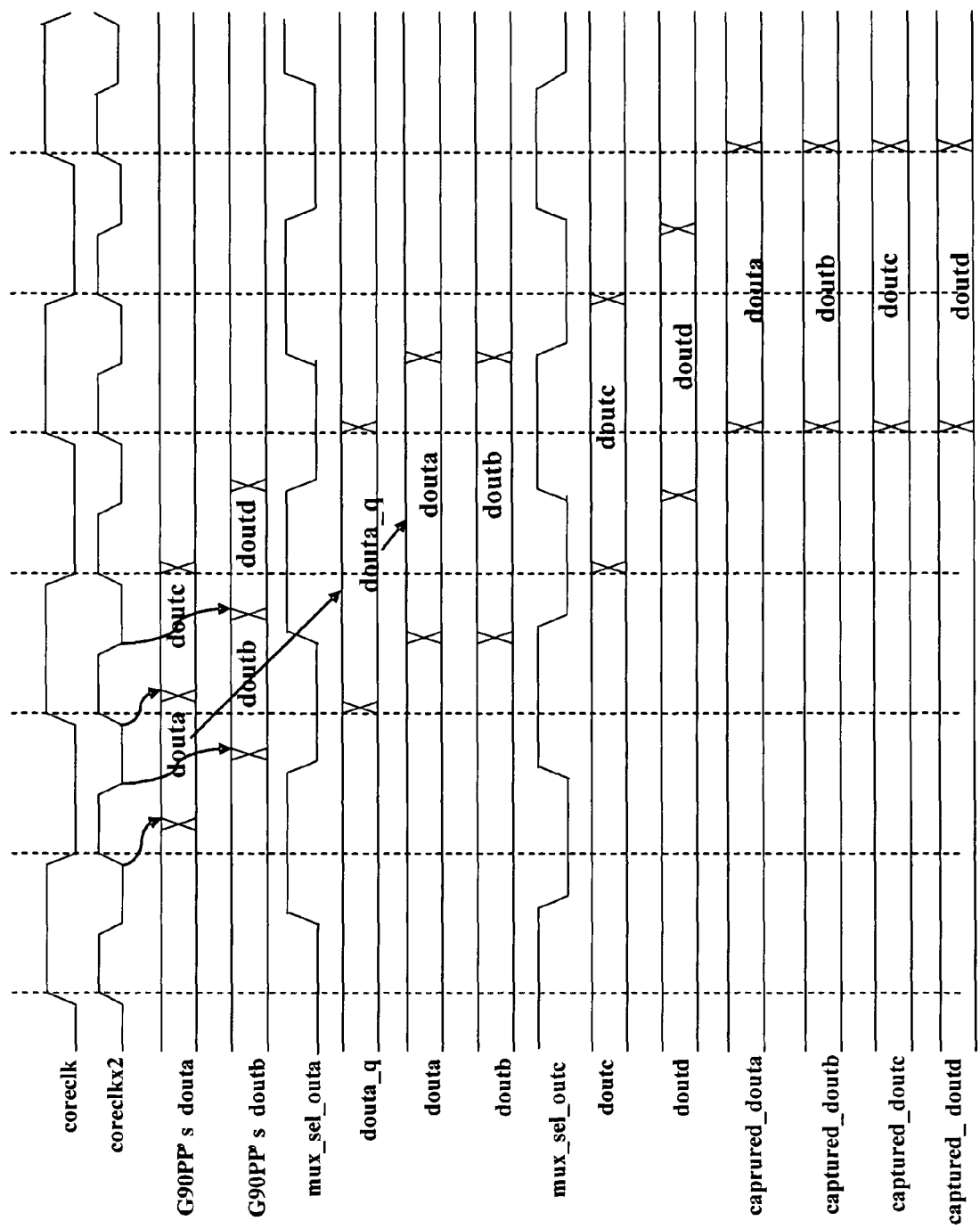
FIG. 7 provides a diagram showing the timing for memory wrapper output in an exemplary embodiment of the present invention.

FIG. 7 illustrates the timing of the reading of the data, where the data is read from the memory at the 2× speed and reformulated back into the 1× clock domain. Therein, the douta and doutb signals are showing being read in the 2× clock domain, where the multiplexer signal mux-sel, selects portions of the output data at a clock rate of the 1× clock domain. Thereafter, four data entries are output in the 1× clock domain as the captured signals in the lower portion of FIG. 7.

The output of the data is also detailed in the flip-flop structures of FIG. 3. The two outputs of the memory, illustrated in FIG. 3, are 330 and 333, where those output signals are applied as inputs to the four output demultiplexers so that the resulting signals can be obtained. Thus, outputs 332, 334, 335, 336, all report similar data streams resulting from the two input signals, fed in at the 2× clock domain. The outputs for the data are provided at 339, 340, 341 and 342 for the four outputs.

The synchronization of the read data path samples data with the 2× clock to create a margin before 1× clock capture the data. This creates a slack pn setup and hold margin. This is illustrated in FIGS. 5 and 6 by the vertical and diagonal arrows. The whole synchronization design tracks the relationship between 1× clock and the 2× clock. Having these two clocks in phase, the system can still tolerate at least plus or minus ⅛ cycle time jitter.

One of average skill in the art will also recognize that the functional building blocks, and other illustrative blocks, modules and components herein, can be implemented as illustrated or by discrete components, application specific integrated circuits, processors executing appropriate software and the like or any combination thereof.

Moreover, although described in detail for purposes of clarity and understanding by way of the aforementioned embodiments, the present invention is not limited to such embodiments. It will be obvious to one of average skill in the art that various changes and modifications may be practiced within the spirit and scope of the invention, as limited only by the scope of the appended claims.

What is claimed:

1. A network device for processing packet data, the network device comprising:
   a first plurality of data communication ports;
   a second plurality of data communication ports; and
   a packet data processing pipeline coupled with the first and second pluralities of data communication ports, the packet data processing pipeline comprising:
      a first ingress module coupled with the first plurality of data communication ports;
      a second ingress module coupled with the second plurality of data communication ports, wherein the first ingress module and the second ingress module are independent of one another, arranged in a parallel fashion and each configured to perform switching functions on respective incoming packet data;
      a memory management unit (MMU) coupled with the two more ingress modules, the MMU being configured to store the incoming packet data in a memory; and
      two or more egress modules coupled with the MMU, the two or more egress modules being configured to transmit the incoming packet data, respectively, to two or more corresponding egress ports, the two or more egress modules being arranged in a parallel fashion,
   wherein the MMU is further configured to receive packet data using a network device clock signal operating at a clock speed for the network device and write the data to the memory using a multiplied clock signal operating at a multiplied clock speed that is greater than the clock speed for the network device, read out the data from the memory at the multiplied clock speed and provide the data to the two or more egress modules at the clock speed for the network device, where the multiplied clock signal is used to sample the network device clock signal to place timing domains of the multiplied clock signal and the network device clock signal in phase.

2. The network device according to claim 1, wherein the multiplied clock speed comprises a doubled clock speed that is double the clock speed for the network device clock signal.

3. The network device according to claim 1, wherein the MMU is further configured to write to and read from the memory four input/output values pipelined together every clock cycle of the clock signal for the network device.

4. The network device according to claim 3, wherein each of the input/output values contains address, command and data components.

5. The network device according to claim 3, wherein the MMU comprises a series of flip-flops and at least one flip-flop is configured to receive each of the four input/output values, where the series of flip-flops is configured to operate at the multiplied clock speed.

6. The network device according to claim 3, wherein the MMU is further configured to create a setup and hold margin with the data in the multiplied clock signal timing domain to facilitate the capture of the data into the network device clock signal timing domain.

7. The network device according to claim 1, wherein the MMU is further configured to tolerate a jitter of one eighth of a clock cycle of the clock for the network device clock signal timing domain and still operate correctly.

8. A method for processing packet data in a packet processing pipeline of a network device, the method comprising:
receiving, at two or more parallel ingress ports of the packet processing pipeline, packet data to be stored, in a memory, by a memory management unit (MMU) of the packet processing pipeline, the packet data being received using a network device clock signal operating at a clock speed for the network device, wherein the packet data is received at a first ingress port of the two or more parallel ingress ports from a first plurality of data communication ports of the network device and at a second ingress port of the two or more parallel ingress ports from a second plurality of data communication ports of the network device, the first and second ingress ports being independent of one another;
writing the packet data to the memory using a multiplied clock signal operating at a multiplied clock speed that is greater than the clock speed for the network device;
reading out the data from the memory at the multiplied clock speed; and
providing the data to at least two egress modules of the packet processing pipeline at the clock speed for the network device,
wherein the multiplied clock signal is used to sample the network device clock signal to place timing domains of the multiplied clock signal and the network device clock signal in phase.

9. The method according to claim 8, wherein the reading and writing are performed using a doubled clock speed that is double the clock speed for the network device.

10. The method according to claim 8, wherein the reading comprises reading four output values pipelined together from the memory every clock cycle of the clock for the network device and the writing step comprises writing four input values pipelined together to the memory every clock cycle of the clock for the network device.

11. The method according to claim 10, wherein the writing comprises writing four address, command and data components to the memory every clock cycle and the reading step comprises reading four address, command and data components from the memory every clock cycle for the network device.

12. The method according to claim 10, wherein MMU comprises a series of flip-flops and the writing further comprises receiving each of the four input/output values at least one flip-flop, wherein the series of flip-flops is configured to operate in the multiplied clock signal timing domain.

13. The method according to claim 10, wherein the reading is performed such that a setup and hold margin is created with the data in the multiplied clock signal timing domain to facilitate the capture of the data into the network device clock signal timing domain.

14. The method according to claim 8, wherein the method is performed such that the method tolerates a jitter of one eighth of a clock cycle of the network device clock signal and still operates correctly.

15. An apparatus for processing packet data in a packet processing pipeline of a network device, the apparatus comprising:
a first plurality of data communication port means;
a second plurality of data communication port means;
first and second independent and parallel receiving means for receiving, from, respectively, the first plurality of data communication port means and the second plurality of data communication port means, data to be stored in a memory by a memory management unit (MMU) using a network device clock signal operating at a clock speed for the network device;
writing means for writing the data to the memory using a multiplied clock signal operating at a multiplied clock speed that is greater than the clock speed for the network device;
reading means for reading out the data from the memory at the multiplied clock speed; and
providing means for providing the data to two or more parallel egress modules of the packet processing pipeline network device at the clock speed for the network device;
wherein the multiplied clock signal is used to sample the network device clock signal to place timing domains of the multiplied clock signal and the network device clock signal in phase.

16. The apparatus according to claim 15, wherein the reading and writing means are configured to use a doubled clock speed that is double the clock speed for the network device.

17. The apparatus device according to claim 15, wherein the reading means comprises second reading means for reading four output values pipelined together from the memory every clock cycle of the clock for the network device and the writing means comprises second writing means for writing four input values pipelined together to the memory every clock cycle of the clock for the network device.

18. The apparatus according to claim 17, wherein the second writing means comprises third writing means for writing four address, command and data components to the memory every clock cycle and the second reading means comprises third reading means for reading four address, command and data components from the memory every clock cycle.

19. The apparatus according to claim 17, wherein the second writing means comprises a series of flip-flops and the series of flip-flop is configured to receive each of the four input/output values at least one flip-flop and to operate in the multiplied clock signal timing domain.

20. The apparatus according to claim 17, wherein the second reading means is configured to create a setup and hold margin with the data in the multiplied clock signal timing domain to facilitate the capture of the data into the network device clock signal timing domain.

* * * * *